United States Patent [19]

Alvite et al.

[11] 4,439,735
[45] Mar. 27, 1984

[54] METHOD AND APPARATUS FOR TESTING LINE SCREEN CRT REGISTRATION

[75] Inventors: Armando Alvite, Chicago; Enrico D. Hines, Naperville; Allan D. Kautz, Deerfield, all of Ill.

[73] Assignee: Zenith Radio Corporation, Glenview, Ill.

[21] Appl. No.: 284,031

[22] Filed: Jul. 17, 1981

[51] Int. Cl.³ .................................. G01R 31/22
[52] U.S. Cl. ................................ 324/404; 324/410; 358/10
[58] Field of Search ............... 324/404, 409, 408, 410; 358/10, 51, 52

[56] References Cited

U.S. PATENT DOCUMENTS 3,401,331 9/1968 Mussulman .................. 324/404
4,254,432 3/1981 Nakahata .................... 358/10

FOREIGN PATENT DOCUMENTS 1220900 1/1971 United Kingdom ............ 324/404

Primary Examiner—Michael J. Tokar
Assistant Examiner—Kevin D. O'Shea

[57] ABSTRACT

A method and apparatus are described for testing a line screen CRT for misregistration between its electron beam and the beam's phosphor stripe targets. The test method includes sensing light output at a plurality of test areas on the CRT screen as the electron beam is stepped across its phosphor targets. The maximum and minimum light outputs of each test area, and the beam locations at which the maximum and minimum light outputs were obtained, are used to compute the degree of misregistration for each test area.

6 Claims, 9 Drawing Figures

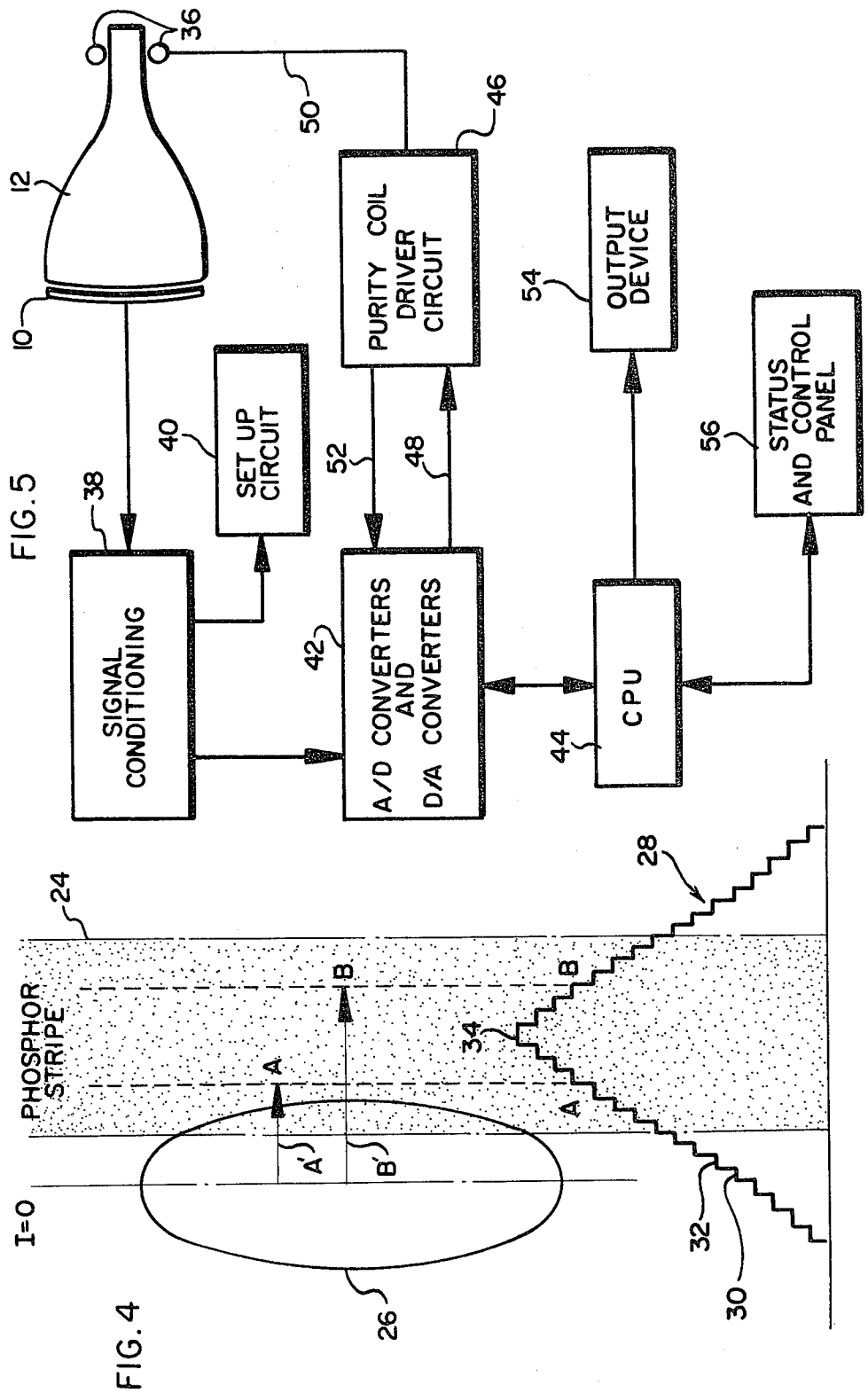

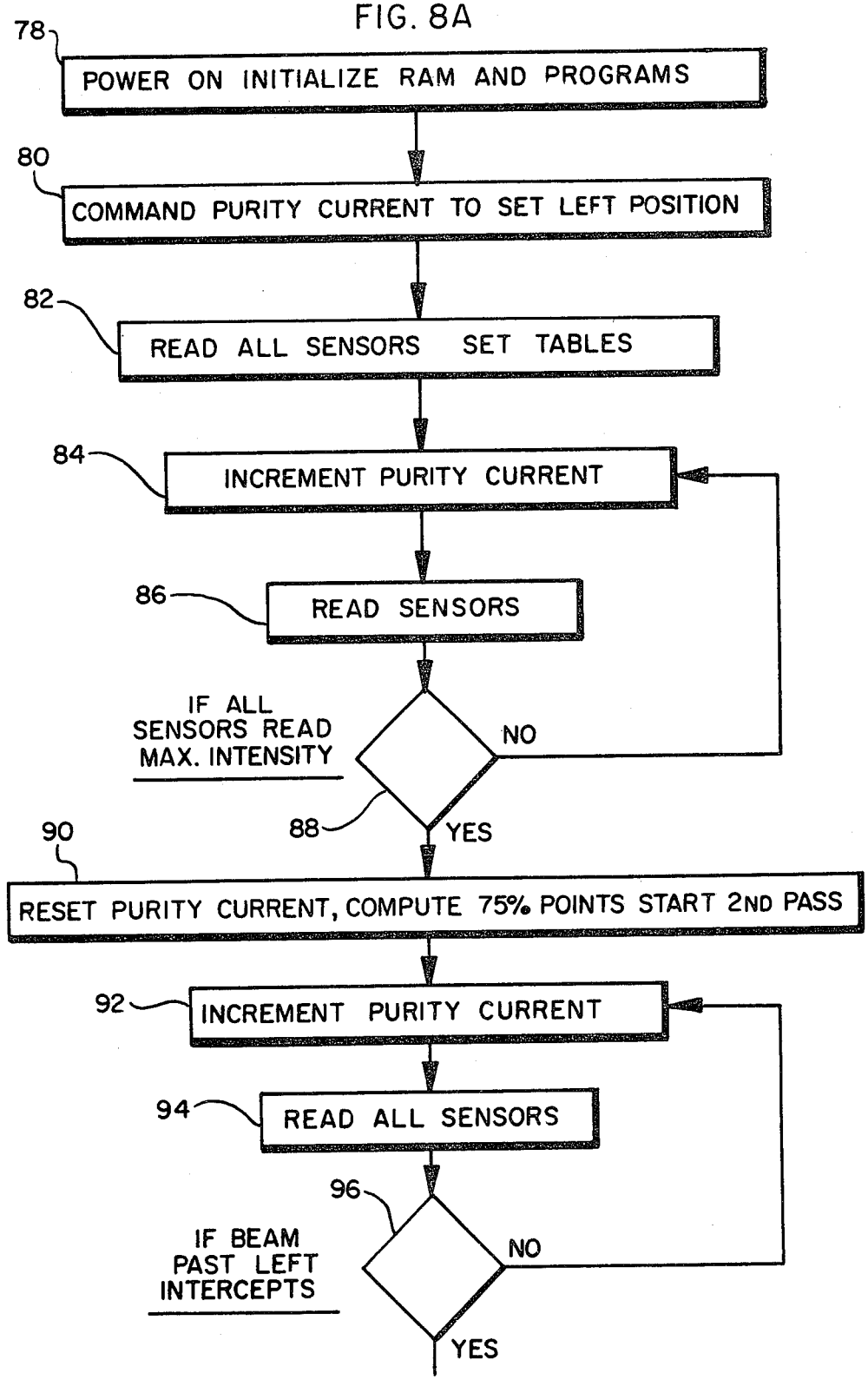

METHOD AND APPARATUS FOR TESTING LINE SCREEN CRT REGISTRATION

BACKGROUND OF THE INVENTION

This invention is directed generally to improvements in the testing of line screen CRTs (cathode ray tubes). It is particularly directed to a method and apparatus for detecting the degree of misregistration between a line screen CRT's electron beam and the phosphor stripes which the beam is intended to excite.

For a color CRT to develop an image of high brightness and high purity, the CRT's electron beams must impinge on the proper phosphor stripes. The extent to which the electron beams stray from their intended targets is referred to as misregistration.

The extent of misregistration, if any, depends upon a number of factors, but it is particularly dependent upon the quality of the light house lens which is used in the deposition of phosphor targets on the CRT screen. Developing a lens to achieve good registration has been a very time consuming process which is subject to human error.

One step in the development of a good lens involves measuring the misregistraton of a CRT made with a prototype lens, and then modifying the lens to eliminate or reduce the measured misregistration. Typically, the measurement of misregistration includes first constructing a CRT with oversize phosphor targets, energizing the CRT, and then photographing multiple areas of the CRT screen under electron beam bombardment. After developing the photographs, measurements are made on the photographs to determine the distance between the center of the electron beam and the center of its phosphor target. Based on those measurements, the prototype lens may be refined to reduce the CRT's misregistration, and another set of measurements may be made to confirm that the lens achieves its objective.

Two problems are associated with the conventional registration test described above. Firstly, it is very time consuming, expensive, and subject to human error. Secondly, it requires the use of a special CRT with oversize phosphor targets. It is desirable, therefore, to provide a method of measuring misregistration which is faster and which uses production type tubes to obtain more accurate registration information.

OBJECTS OF THE INVENTION

It is a general object of the invention to provide an improved method and apparatus for measuring misregistration in line screen color CRTs.

It is a more specific object of the invention to provide such a method and apparatus which uses production type line screen CRTs, and which is faster and less subject to human error than conventional testing procedures.

BRIEF DESCRIPTION OF THE FIGURES

The objects stated above and other objects of the invention are set forth more particularly in the following detailed description of the accompanying drawings of which:

FIG. 4 depicts a single phosphor stripe located at one test area of the CRT, an electron beam spot, and a curve illustrating the sensed light output of the phosphor stripe as the beam spot is stepped across the phosphor stripe;

FIG. 5 is a block diagram showing the registration measurement circuitry shown in FIG. 1 in more detail and the way in which it interfaces with a CRT under test;

FIGS. 8A and 8B constitute a flow chart illustrating how the central processor of FIG. 5 may be programmed.

DESCRIPTION OF THE PREFERRED EMBODIMENT

Figure 1:
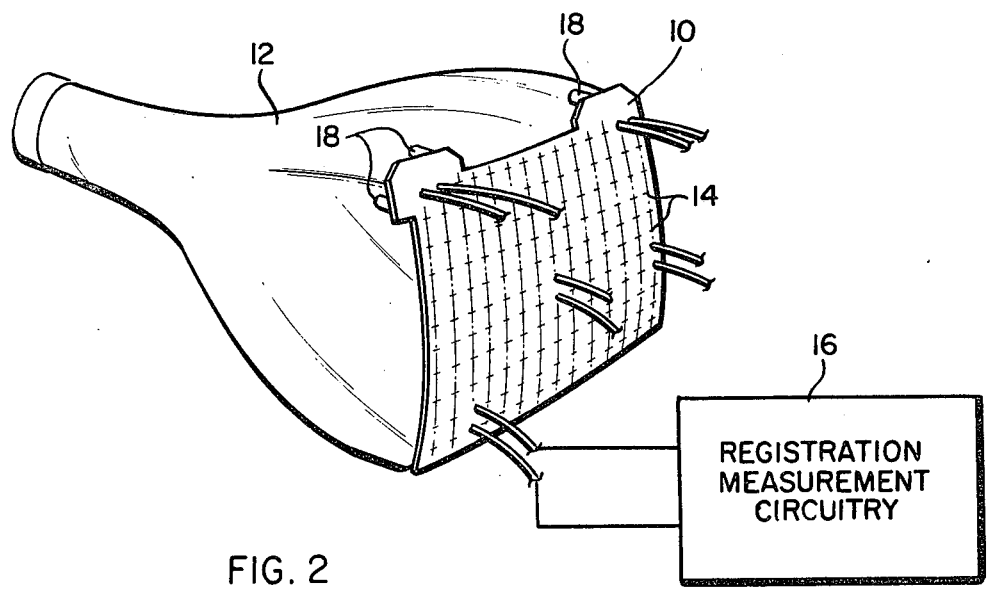
FIG. 1 illustrates a CRT under test, a test fixture, and a schematic representation of registration measurement circuitry for use in testing the misregistration of the CRT according to the invention.

Referring to FIG. 1, a test fixture 10 is shown mated with a line screen CRT 12 whose registration is to be measured in accordance with the procedure described below. Generally, a plurality of test areas are selected on the screen of the CRT, the light output of each test area is sensed by light sensors 14 disposed on the test fixture, and the outputs of the light sensors are applied to registration measurement circuitry 16. The latter device causes the CRT's electron beam to be stepped across its phosphor stripe targets on the screen of the CRT, and records data for a plurality of beam locations to compute misregistration.

Figure 2:
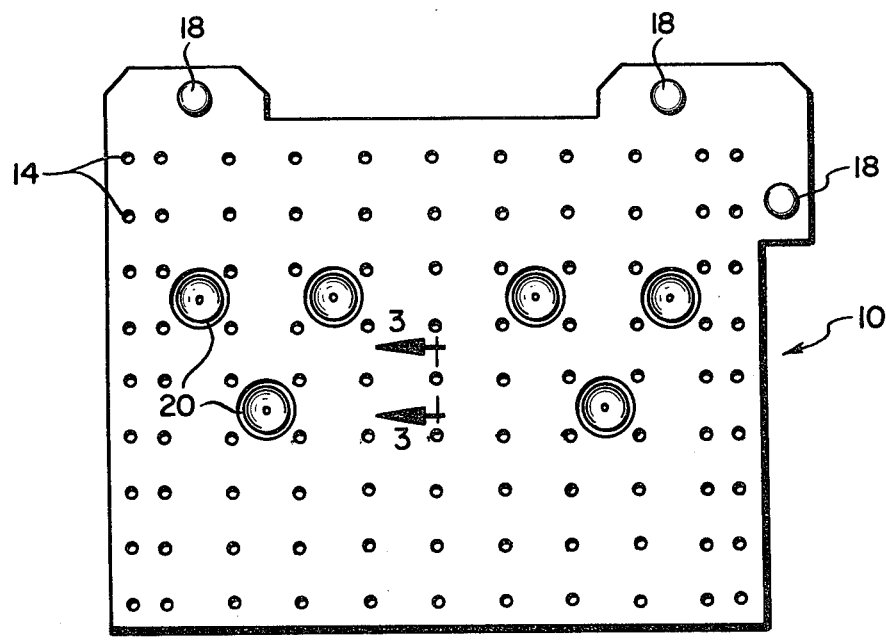
FIG. 2 shows the rear of the test fixture illustrated in FIG. 1.

The fixture 10 may include 99 light sensors arranged in a pattern for sensing the light output of each of 99 test areas on the CRT screen. To hold the test fixture in alignment with the screen, three pins 18 are mounted on the panel for engaging the skirt of the CRT's faceplate. In addition, vacuum assisted suction cups 20 (FIG. 2) may be disposed on the rear surface of the test fixture for holding it against the screen of the CRT.

Figure 3:
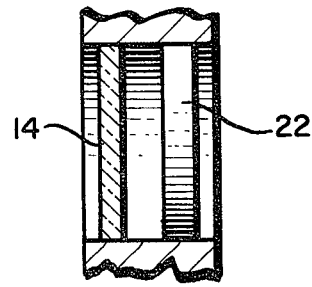
FIG. 3 is a sectional view of a portion of the test fixture to illustrate how an exemplary light sensor and a filter are disposed in the test fixture.

As an initial step in the registration test, a field of substantially uniform color is established on the CRT screen. In situations where the CRT includes three in-line electron guns, the center gun (typically, the green gun), is turned on and the other two guns are biased off conventionally. The usual CRT deflection circuitry (not shown) is activated for establishing a raster of green, for example, on the CRT screen. To sense the green light output of the screen, each of the light sensors 14 (photo resistors, for example) is recessed in the fixture 10 as shown in FIG. 3, and a green filter 22 is disposed in front of the light sensor. The purpose of the recess is to ensure that only the light from a designated test area is received by the light sensing device. The filter 22 substantially excludes or limits all light from impinging on the light sensor except that which is the color which the activated electron gun is intended to produce.

Each of the light sensors is preferably adapted to sense a circular test area having a diameter of about one quarter inch for averaging the light output of a plurality of phosphor stripes encompassed within the test area.

The manner in which the light output of the various test areas is measured and misregistration computed is best explained with reference to FIG. 4. This figure illustrates a single phosphor stripe 24 encompassed within a test area, an electron beam spot 26, and a curve 28 which represents the measured light output of the test area at various positions of the electron beam spot. As described in more detail below, the electron beam is incrementally stepped across the phosphor stripe by, for example, disposing a purity coil around the neck of the CRT and incrementally increasing current in the purity coil to step the electron beam across its phosphor target. It will be appreciated that in a line screen CRT with vertically oriented phosphor stripes, misregistration will only be a problem in the horizontal direction.

As shown, the electron beam spot is situated at one side of the phosphor stripe 24 in a starting position. The illustrated position of the spot may be obtained by deflecting the electron beam there by means of current in the purity coil, or the beam may land in the illustrated position naturally when the current in the purity coil equals zero. For purposes of discussion, the electron beam spot is assumed to be at its starting position with a purity coil current of zero.

With the electron beam at its illustrated starting position, the output of the line sensor which detects light from the phosphor stripe 24 is measured. For example, the value of light indicated at 30 on the curve 28 may correspond to the light emitted by the phosphor stripe when the electron beam is in its starting position.

Next, the electron beam is stepped to the right, and the light output of the phosphor stripe is again measured and stored. The value of light at this new position of the electron beam is indicated at 32 on the curve 28.

The position of the electron beam continues to be stepped across the phosphor stripe at least until the registration measurement circuitry determines that a position of maximum light has been obtained, as at position 34.

While the electron beam is being stepped across the phosphor stripe (approximately 100 steps of the beam may be effected), the location of the electron beam may be stored along with the value of the light output by the phosphor stripe at each location. Hence, knowing the position of the electron beam at point 34, the degree of misregistration may be calculated as the distance between the electron beam spot locations 30 and 34. The same electron beam stepping, light output sensing, and computation is effected concurrently for each test area on the CRT screen.

Because the individual light sensors 14 typically differ from each other in their response to light (because of manufacturing tolerances and the like), it is preferred that the absolute values of the outputs of the light sensors not be used to compute misregistration. Instead, after having found the minimum and maximum light outputs (at positions 30 and 34) the registration measurement circuitry computes and stores a predetermined percentage of the measured maximum light output. In the present embodiment, 75% of the maximum light output is computed and stored. In the case where the registration measurement circuitry has a memory large enough to store each sensed value of light from the phosphor stripe and the location of the beam at which each value was measured, the memory may be searched to find the beam position locations at which 75% of the maximum light output was obtained. These locations are indicated as A and B in FIG. 4 and correspond to movement of the electron beam over distances A' and B' To compute misregistration, the distances A' and B' are averaged, as by adding the distance A' to the distance B' and dividing their sum by two. The result is a number (typically in thousandths of an inch) representing the extent of misregistration between the electron beam and its phorphor target.

Where the registration measurement circuit has a small memory, it may store only the maximum and minimum values of light output, and compute the values of light output which correspond to the 75% points A and B. Then the beam may be deflected by current in the purity coil back to the starting position shown in FIG. 4. Now the electron beam is again stepped across the phosphor stripe, the light output of the phosphor stripe is measured at each position of the beam, and the position of the beam is stored when the measured light output corresponds to the light output computed for position A. The electron beam continues to be stepped until the measured light output corresponds to that computed for position B and the position of the beam is stored. Misregistration is then computed as described above by averaging the distance A' and B'.

Apparatus for carrying out the steps described above and other procedures not previously described is illustrated in FIG. 5. As shown, a purity coil 36 is situated around the neck of the CRT 12 for adjusting the position of the electron beam. In effect, varying the current in the coil 36 changes the purity exhibited by the CRT.

The outputs of the light sensors in the test fixture 10 may be coupled to a signal conditioning network 38. This network may include a conventional low pass R-C filter, one for each light sensor, to remove 60 cycle and other undesired components from the output of a light sensor. The filtered output of the network 38 is applied to a set up circuit 40 and a converter 42.

The set up circuit 40 is used only in preparing the CRT for test. It may be adapted to receive the output of two photocells which straddle the center of the CRT screen, and preferably includes indicators which show an operator the light output of those two photocells. The operator then adjusts the yoke (not shown) of the CRT for maximum output from the two centrally located photocells. Thus, each CRT which is tested can be set up in the same manner to achieve repeatable measurement results.

The converter 42 includes a conventional analog-to-digital converter for digitizing the analog output of the signal conditioning network 38 and for applying the digitized signal to a central processing unit 44. The latter device is programmed to store and compute the data described above and to issue commands for stepping the electron beam across its phosphor targets. Those commands are digital in form and are sent to the converter 42 which includes a digital-to-analog converter for transmitting the commands in analog form to a purity coil driver circuit 46 via a lead 48. In response to received commands, the driver circuit 46 increments current in the purity coil via a lead 50. Another lead 52 carries analog values of the purity coil current to the converter 42 which digitizes them and sends them to the central processor 44. The latter device confirms that its previously issued purity current commands have been executed.

The illustrated circuitry may also include an output device 54 and a status and control panel 56. The output device, any conventional recorder, printer, or CRT terminal, is coupled to the central processor for recording the brightness and beam location data received by the central processor. The recorded data may be retained as a visual record of the registration measurements.

The status and control panel 56 may be any conventionl device suitable for inputting to the central processor data such as the identifying number of the CRT being tested, the test number, and any other information which it may be desired to record on the output device 54.

In construction, the converter 42 may include a conventional 12 bit analog-to-digital and digital-to-analog converter. The central processor may be a conventional CPU board which includes a microprocessor, memory devices, and a priority encoder, such as model SBC 20-4 made by Intel of Santa Clara, California. The set up circuitry 40 and the purity coil driver network 46 may be constructed as shown in FIGS. 6 and 7, respectively.

Figure 6:
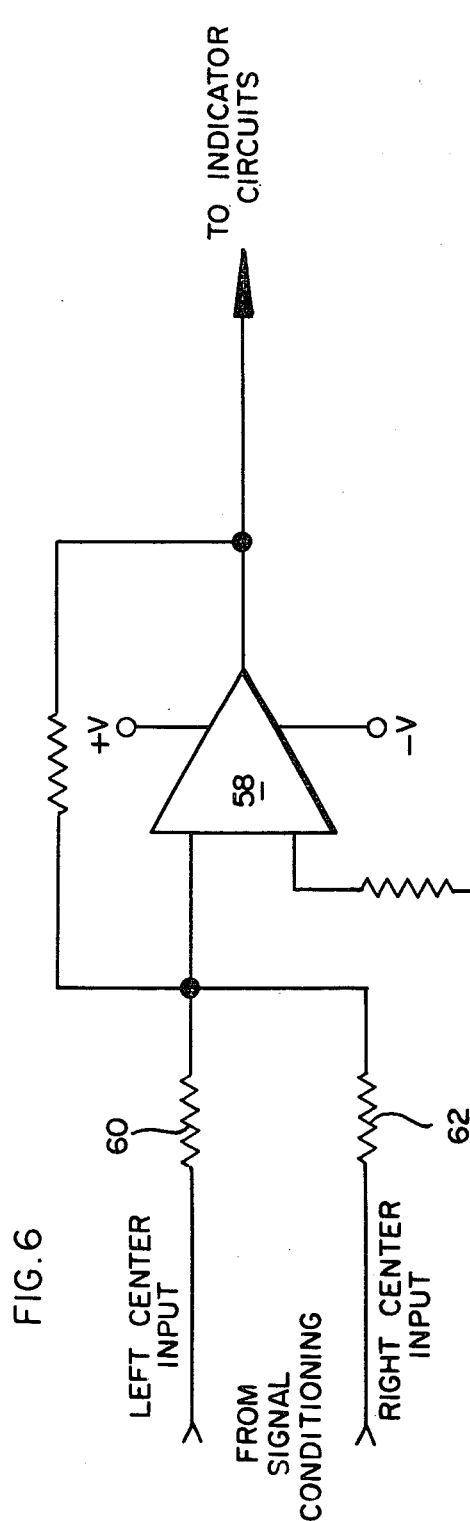
FIG. 6 is a detailed circuit diagram of a portion of the set up circuit shown in FIG. 5.

Referring to FIG. 6, the set up circuit may include an amplifier 58 which receives, at terminal 60, the light signal output of a sensor located at the left of screen center. The light signal output of a sensor located to the right of screen center is received at another terminal 62. The output of the amplifier 58 may be coupled to any conventional indicator which gives a representation of light level.

Figure 7:
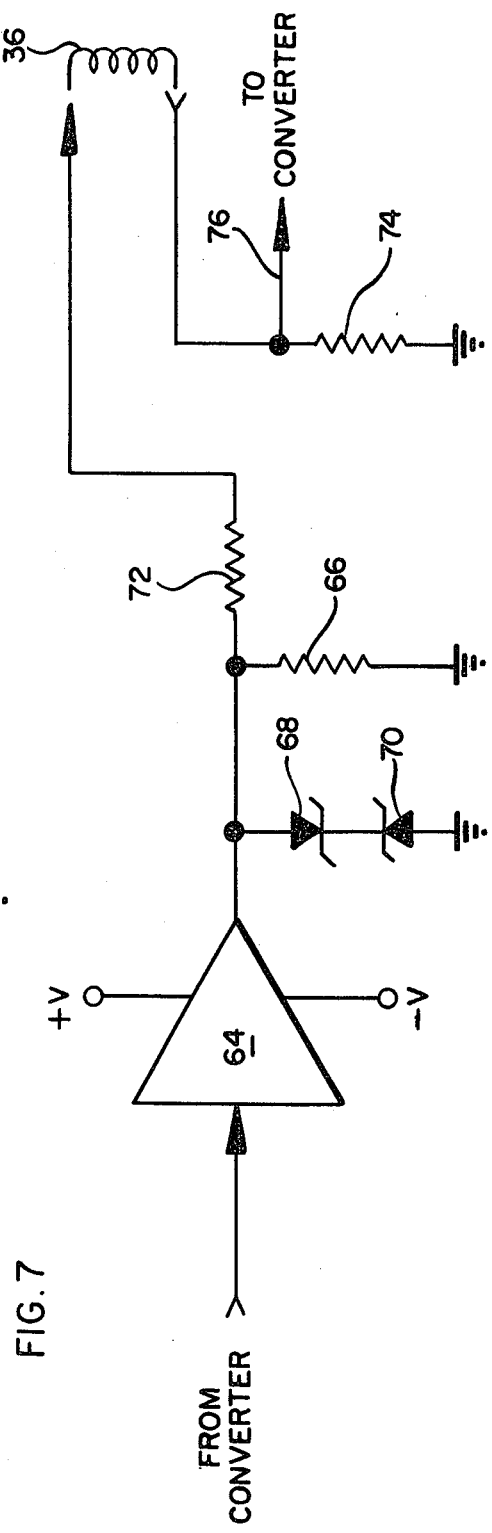
FIG. 7 is a detailed circuit diagram of the purity coil driver circuit shown in FIG. 5.

As shown in FIG. 7, the purity coil driver circuit may include an amplifier 64 receiving analog purity coil commands from the converter 42. The output of the amplifier 64 is coupled to ground through a resistor 66 and a pair of diodes 68 and 70, and is coupled via a resistor 72 to the purity coil 36. The return side of the purity coil is coupled to a grounded resistor 74 across which a voltage is developed to indicate the level of current being applied to the purity coil by the amplifier 64. A lead 75 couples the voltage across the resistor 74 to the converter 42 which digitizes it and applies it to the central processor to confirm that the purity current commands have been executed.

Figure 8B:
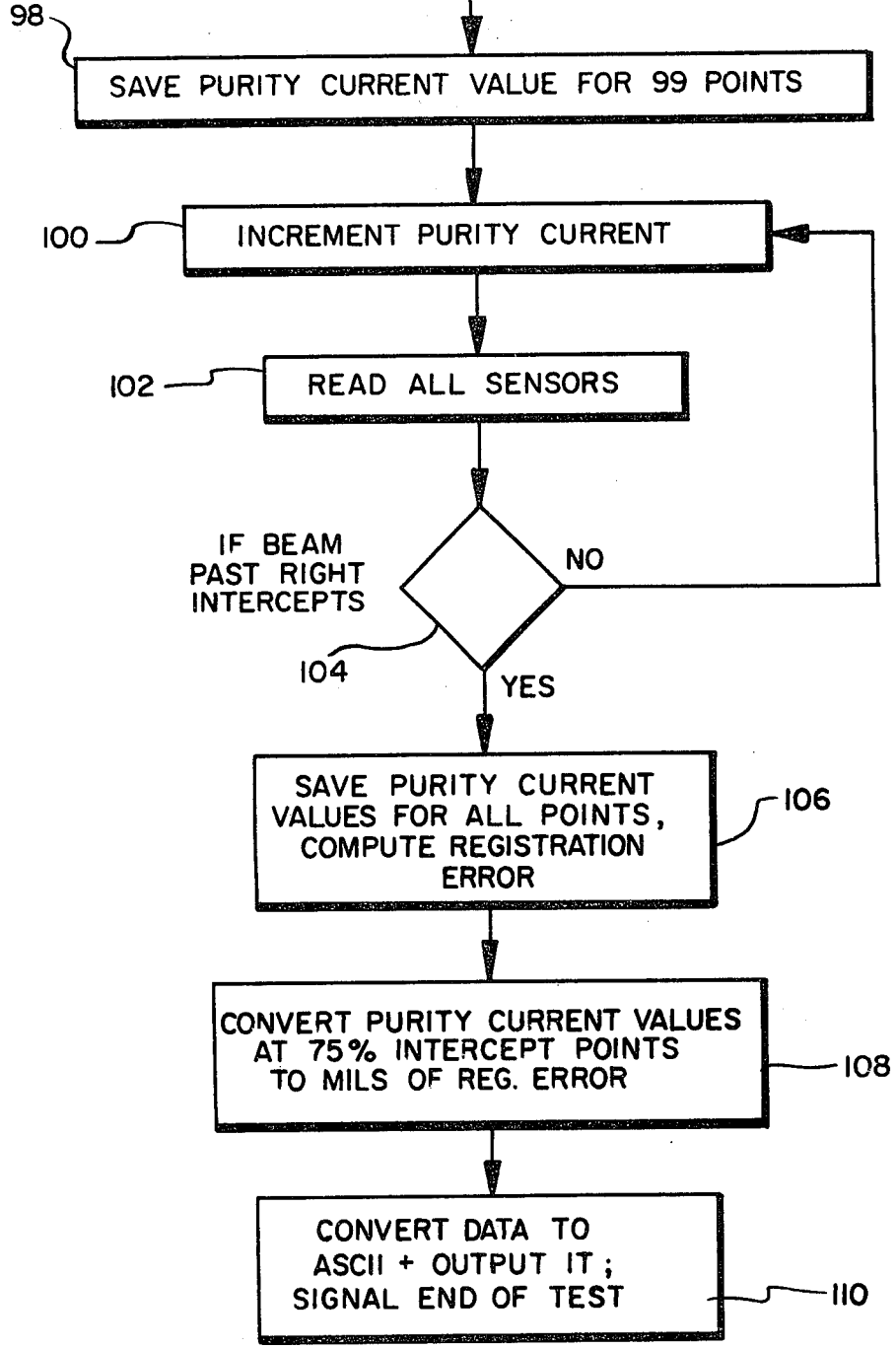

Programming of the microprocessor on the CPU board may be effected conventionally in accordance with the steps described above. FIGS. 8A and 8B show a flow chart depicting the basic logic by which the microprocessor associated with a limited memory may be programmed.

Referring to FIG. 8A, the program begins with a power up and initializing instruction 78. The next instruction 80 commands the purity coil driver circuit 46 to establish a current in the purity coil such that the electron beam is positioned at the starting location shown in FIG. 4. According to instruction 82, the outputs of all light sensors are read to determine the brightness levels at all test areas while the beam is in its starting position. In addition, tables in memory are set to store, for each test area, the values of the highest and lowest brightness readings. As the beam is stepped across its targets, the stored values are updated as larger (or smaller) values of brightness readings are sensed.

After the initial brightness readings have been taken, instruction 84 commands that current in the purity coil be incremented to step the electron beam to the next position. Each such step may be effected by increasing purity coil current by about 1.4 milliamperes. All light sensors are then read again (instruction 86) and the tables are updated.

At instruction 88, a decision is made as to whether all the light sensors have yet output a reading of maximum light intensity, i.e., whether the point 34 in FIG. 4 has been reached. If all maximum light intensity readings have not occurred, the program loops through instructions 84, 86 and 88 until maximum readings are obtained. When that occurs, the program proceeds to instruction 90.

At this time, the central processor computes the 75% values (points A and B in FIG. 4), resets the purity coil current to reposition the electron beam at its starting position, and begins the second pass across the phosphor targets by again incrementing purity coil current (instruction 92). All light sensors are read again (instruction 94) and a determination is then made as to whether the electron beam has passed the left 75% point A (instruction 96. If this effect has not occurred, the program loops through instructions 92, 94 and 96 until the electron beam has been stepped to the location on the phosphor targets which corresponds to point A. The value of the purity current required to reach point A is stored (instruction 98), and the purity current is incremented again (instruction 100).

Instructions 102 and 104 cause all light sensors to be read against and the electron beam stepped across the phosphor targets until point B (FIG. 4) is reached. The value of the purity current required to reach point B is stored, and the registration error is computed by averaging the values of purity current which were established at points A and B (instruction 106).

The value of the registration error may be converted from milliamperes of purity coil current to distance by storing appropriate conversion factors in the central processor. These conversion factors, one for each test area, may be determined experimentally by changing the current in the purity coil to introduce misregistration, and conventionally measuring the resultant displacement of the electron beam. The amount of current in the purity coil and the measured displacement may be used to compute a conversion factor in terms of thousandths of an inch per milliampere of current. The same procedure is used to determine a conversion factor for each test area on the CRT screen. All such conversion factors may be stored in the memory associated with the central processor.

Returning to FIG. 8B, instruction 108 commands the central processor to convert the values of purity coil current measured at the 75% points A and B to misregistration in terms of mils (thousandths of an inch) by using the conversion factors described above. Hence, for each of the 99 test areas on the CRT screen, misregistration is computed. That data may be read out of the central processor in ASCII format for recording by the output device 54 (instruction 110).

The misregistration test described above typically takes about eight minutes compared to the eight to sixteen hours required for conventional misregistration tests. Moreover, the present test procedure is not subject to any substantial human error, and does not require a specially made CRT. Hence, quality control may be implemented merely by testing various CRTs as they come off the production line.

Although the present invention arose out of the need to use misregistration results in refining light house lenses, it has other uses as well. For example, the misregistration data may be gathered on a production line and used to automatically adjust purity, as by automatically adjusting purity magnets on a CRT. When used in this environment, fewer test areas may be sensed to speed up the test.

Although the present invention has been described in terms of preferred steps and apparatus, it will be obvious to those skilled in the art that many alterations and modifications may be made without departing from the invention. Accordingly, it is intended that all such modifications and alterations be considered as within the spirit and scope of the invention as defined by the appended claims.

What is claimed is:

1. For a line screen CRT having a screen on which phosphor stripe targets are deposited, and having at least one electron beam for exciting the phosphor stripe targets, a method for measuring misregistration between the electron beam and its phosphor stripe targets, comprising:

establishing a field of substantially uniform color on the CRT screen;

locating a plurality of light sensing devices at a corresponding number of selected test areas on the CRT screen;

measuring the output of the light sensing devices to obtain brightness readings at the test areas on the CRT screen;

stepping the electron beam across its phosphor stripe targets encompassed by the test areas and measuring the output of the light sensing devices after each increment to obtain additional brightness readings;

storing, for each test area, at least the minimum and maximum brightness readings and data representative of the beam locations where each minimum and maximum reading occurred;

determining, for each test area, the extent of misregistration based on the beam locations at which the minimum and maximum brightness readings occur by;

computing a preselected percentage of the maximum brightness reading;

detecting first and second beam locations for each test area at which the preselected percentage of maximum brightness occurs; and computing misregistration by determining the average of said first and second beam locations.

2. A method as set forth in claim 1 wherein stepping the electron beam across its targets includes disposing a purity coil around the neck of the CRT and establishing currents in the coil for incrementally stepping the electron beam across its targets.

3. A method as set forth in claim 2 wherein the step of storing the location of the minimum and maximum brightness readings includes storing the values of current in the purity coil which stepped the electron beam to those locations and converting the stored values of current to misregistration distances.

4. For a line screen CRT having a screen on which phosphor stripe targets are deposited and having at least one electron beam for exciting the phosphor stripe targets, a method for measuring misregistration between the electron beam and its phosphor stripe targets, comprising:

disposing a purity coil around the neck of the CRT;

establishing a field of substantially uniform color on the CRT screen;

locating a plurality of light sensing devices at a corresponding number of selected test areas on the CRT screen;

establishing current through the purity coil to deflect the electron beam to one side of its phosphor targets;

measuring the output of the light sensing devices to obtain brightness readings at the test areas on the CRT screen;

incrementing the current in the purity coil to step the electron beam across its phosphor targets which are encompassed by the test areas;

measuring the output of the light sensing devices after each increment to obtain additional brightness readings;

storing, for each test area, the minimum and maximum brightness readings;

computing a preselected percentage of the maximum brightness readings;

incrementing purity coil current to move the electron beam until its phosphor targets produce the preselected percentage of their maximum brightness readings at two beam positions in each test area;

sensing and storing the value of purity current required to move the electron beam to said two beam positions; and computing misregistration as a function of the values of purity current required to deflect the electron beam to said two beam positions.

5. For use with a CRT having a line screen on which phosphor stripe targets are deposited and at least one electron beam for exciting the phosphor stripe targets, a system for measuring misregistration between the electron beam and its phosphor stripe targets, comprising:

a plurality of light sensing devices situated at a corresponding number of selected test areas on the CRT screen;

means for positioning the electron beam to one side of its phosphor stripe targets encompassed within the test areas, and for incrementally stepping the electron beam across the targets in response to a control signal; said positioning means including a purity coil disposed around the neck of the CRT; and circuit means for developing the control signal for supplying current to said purity coil, for measuring the output of the light sensing devices when the electron beam is at one side of its phosphor stripe targets and after each incremental step of the electron beam to obtain a plurality of brightness readings at each test area, for storing the minimum and maximum brightness readings associated with each test area and data representative of the locations where each minimum and maximum reading occurred, for computing a preselected percentage of said stored maximum brightness readings, for storing the data representative of the locations where said preselected percentages of maximum brightness occurred by sensing the value of purity coil current at those locations and for determining, for each test area, the extent of misregistration based on the locations of the minimum and maximum brightness readings by converting the values of coil current to misregistration distances.

6. A system as set forth in claim 5 wherein said circuit means includes:

purity coil driver means for incrementing the current in the purity coil and for developing a purity output signal indicative of the current in the purity coil;

converter means for converting the outputs of the light sensing devices to digital signals and for converting the purity output signal to a digital signal;

a processing unit for receiving and storing digital signals output by said converter means, for inputting to the converter means digital commands for incrementing purity current, and for computing the extent of misregistration based on the stored digital signals, said converter means being adapted to convert said digital commands to analog commands for application to the purity coil driver means for incrementing purity coil current.

* * * * *